(12) United States Patent
Cheng et al.

(10) Patent No.: US 9,601,245 B2
(45) Date of Patent: Mar. 21, 2017

(54) MAGNETOELECTRIC EFFECT MATERIAL AND METHOD FOR MANUFACTURING SAME

(75) Inventors: Yao Cheng, Hsinchu County (TW); Ben-Li Young, Hsinchu (TW); Chih-Hao Lee, Hsinchu (TW)

(73) Assignee: HOKANG TECHNOLOGY CO., LTD., Hsinchu (TW)

( * ) Notice: Subject to any disclaimer, the term of this patent is extended or adjusted under 35 U.S.C. 154(b) by 424 days.

(21) Appl. No.: 14/376,276

(22) PCT Filed: Feb. 3, 2012

(86) PCT No.: PCT/CN2012/070863
§ 371 (c)(1),
(2), (4) Date: Dec. 18, 2014

(87) PCT Pub. No.: WO2013/113165
PCT Pub. Date: Aug. 8, 2013

(65) Prior Publication Data
US 2015/0105262 A1    Apr. 16, 2015

(51) Int. Cl.
| | |
|---|---|
| *C22B 34/24* | (2006.01) |
| *H01L 39/12* | (2006.01) |
| *H01F 1/00* | (2006.01) |
| *C22C 27/02* | (2006.01) |
| *H01F 41/00* | (2006.01) |
| *H01L 39/24* | (2006.01) |

(52) U.S. Cl.
CPC .......... *H01F 1/0009* (2013.01); *C22B 34/24* (2013.01); *C22C 27/02* (2013.01); *H01F 41/00* (2013.01); *H01L 39/12* (2013.01); *H01L 39/2406* (2013.01)

(58) Field of Classification Search
CPC ......... C22B 34/24; C22C 27/02; H01L 39/12; H01L 39/2406; H01F 41/00
See application file for complete search history.

(56) References Cited

U.S. PATENT DOCUMENTS

2016/0035674 A1\* 2/2016 Zhang ............... H01L 23/53204
257/750

OTHER PUBLICATIONS

Cheng, Y., Nuclear spin-density wave theory, arXiv.org, Jul. 9, 2009, 5 pages.
(Continued)

*Primary Examiner* — Colleen Dunn
(74) *Attorney, Agent, or Firm* — WPAT, P.C., Intellectual Property Attorneys; Anthony King

(57) ABSTRACT

The invention provides the Magnetoelectric Effect Material consisted of a single isotope, the alloy of isotopes, or the compound of isotopes. The invention applies enrichment and purification to increase the isotope abundance, to create the density of nuclear exciton by irradiation, and therefore increase the magnetoelectric effect of the crystal of single isotope, the alloy crystal of isotopes and the compound crystal of isotopes. The invention provides the manufacturing method including the selection rules of isotopes, the fabrication processes and the structure of composite materials. The invention belongs to the area of the nuclear science and the improvement of material character. The invention using the transition of entangled multiple photons to achieve the delocalized nuclear exciton. The mix of selected isotopes adjusts the decay lifetime of nuclear exciton and the irradiation efficiency to generate the nuclear exciton.

40 Claims, 2 Drawing Sheets

(56) References Cited

OTHER PUBLICATIONS

Figure 1:
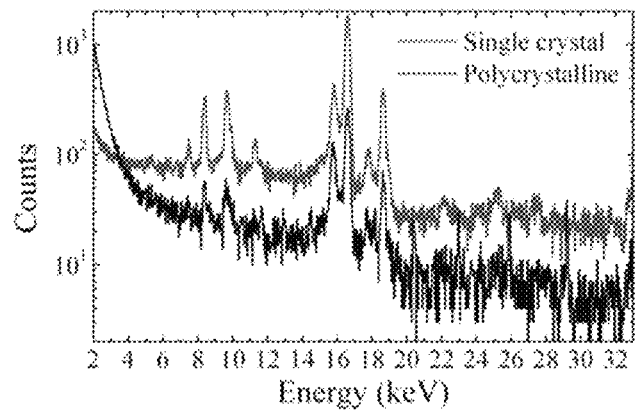

Cheng, Y., Quantum phase transition of the 103mRh spin-density wave, arXiv.org, Jun. 30, 2009, 5 pages.

* cited by examiner

MAGNETOELECTRIC EFFECT MATERIAL AND METHOD FOR MANUFACTURING SAME

TECHNICAL FIELD

This invention relates to a new kind of materials and their manufacturing process, especially relates to materials with magnetoelectric effects, and the preparation methods to obtain these magnetoelectric effects.

BACKGROUND

The following is introduction of the background of the invention.

(1) Magnetoelectric Effects

Conventional materials give the electric polarization by applying the electric field and give the magnetic polarization by applying the magnetic field. A magnetoelectric material contains a pseudoscalar field to induce the different electromagnetic response, i.e. give the magnetic polarization by applying the electric field and give the electric polarization by applying the magnetic field. For example, references[1,2,3] give the theoretical and experimental descriptions of the magnetoelectric effects attributed to its pseudoscalar field in the crystal of $Cr_2O_3$. The pseudoscalar field of $Cr_2O_3$ depends on temperature and gives a maximal value of 0.02 in $[e^2/h]$ at the temperature of 285K, where e is the electric charge and h is the Planck's constant. Therefore, the magnetoelectric effects of $Cr_2O_3$ are very weak. Many weak Magnetoelectric Effect Material like $Cr_2O_3$ are summarized in reference[3]. Reference[4] reports a mechanism that the magnetic Cr ions depart their equivalent positions in crystal by applying an electric field to generate magnetic field. Reference[3] also reports theoretical and experimental evidences of the displacement of Cr ions departing their equivalent positions, the magnetoelectric effects of which are attributed to the magnetic gradient provided by the magnetic quadrupole in the crystal. However, the origin of the magnetic quadrupole is unclear now.

Recently, the new material of topological insulator[5,6] is discovered, which gives a pseudoscalar field stronger than that of the $Cr_2O_3$ crystal by an order of 100 times[7]. The transportation of electrons inside a topological insulator is not allowed due to a topological invariance. Instead, the electrons can move on the edge, i.e. the edge state. The topological invariance may be provided by an applying field and the atomic spin-orbit interaction. Other than the topological insulator, the multiferroics [8] also provides the relative strong magnetoelectric effects. The multiferroics is usually introduced by the coupling between ferroelectric and ferromagnetic effects. The magnetoelectric effect of multiferroics, limited by the permittivity and the permeability, is not attributed to the edge state like the topological insulator. The mechanisms to provide magnetoelectric effects for these two types of materials, topological insulator and multiferroics, are clear, both in the theoretical and the experimental aspects, while the mechanism to provide the weak magnetoelectric effects of $Cr_2O_3$ is still missing.

The transportation of electron on the edge state of a topological insulator is nontrivial, that has a ballistic motion without any scattering interference and therefore without dissipation. This edge state protected by the topological invariance is very stable and free from much interference. When a topological insulator enters a superconducting state, it becomes topological superconductor, which may provide an application of topological quantum computation, to fabricate a quantum computer[5,6].

Unlike the one-dimensional structure, the 2D and 3D topological insulators are practical to be applied, which characterized by the words Z and $Z_2$, i.e. there are four types of 3D-Z, 3D-$Z_2$, 2D-Z, and 2D-$Z_2$. Among that, three types of 3D-$Z_2$, 2D-Z, and 2D-$Z_2$ are found, except 3D-Z type. The 2D-Z type is the thin layer performing the well-known quantum Hall effect. The 3D-$Z_2$ type is known by the topological insulators such as $Bi_2Se_3$, $Bi_2Te_3$, and $Sb_2Te_3$. The 2D-$Z_2$ type is known by the quantum well of HgTe/CdTe[5].

The Magnetoelectric Effect Material containing a pseudoscalar field obey an unusual Maxwell equation, which is indicated by E Wilczek in[9]. Photon transportation becomes unconventional at the very place, where the pseudoscalar field performs the space- or the time-gradient. F. W. Hehl et al. have indicated that the Magnetoelectric Effect Material containing a pseudoscalar field may be applied to detect the other type of pseudoscalar field, such as dark matter. When this magnetoelectric material enters the superconducting state, the screening effect against the electromagnetic interference becomes an advantage of the detection.

(2) The Entangled State of Multiphoton Transition and the Delocalized Nuclear Exciton The Mössbauer state is the first low-lying excited state of nucleus performing an extraordinary precision of photon energy, because the recoil of the gamma emission is taken by the whole crystal and the recoil loss of energy disappears[10]. The femto-meter nuclear size and the forbidden condition of transition give a long lifetime of the Mössbauer gamma transition with energy on the order of 10 keV. For example, the Mössbauer state of $^{57}Fe$ has the 3/2 quantum number of the angular momentum and an odd parity, written by $|3/2^-\rangle$. The ground state of $^{57}Fe$ has the 1/2 quantum number of the angular momentum and an odd parity, written by $|1/2^-\rangle$. The 14.4-keV gamma emission is forbidden by the same parity of the two states to give a long lifetime of 98 ns for the M1 transition. The absorption of this Mössbauer photon by the ground state from another $^{57}Fe$ nucleus in the crystal provides a neV-energy resolution to identify the environmental effect affecting the nuclei. This is the well-known Mössbauer effects. The uncertainty principle predicts that a longer lifetime gives a more precise energy resolution from the emitting photon. However, the extremely high precision of Mössbauer photon is not realizable, simply because the resonant absorption by another nucleus fails. On the contrary, the short life-time of ps cannot provide the valuable energy resolution of neV but 0.1 meV. This invention does not emphasize on increasing the energy resolution, but deals with unconventional nuclear resonant absorption of the particular Mössbauer nuclei to create the nuclear exciton.

In case that the abundence of $^{57}Fe$ in a pure iron crystal is 100%, the emmited Mössbauer photon can be absorbed by the neighboring $^{57}Fe$ nuclei at sufficiently low temperature. Quantum mechanics predicts that we cannot identify the very position of nuclear excitation, which becomes a delocalized state of nuclear excitation (nuclear exciton), similar to the exciton in a semiconductor. The reference[9] has theoretically discussed this state of nuclear exciton.

According to the quantum electrodynamics, the probability of atomic or nuclear transition is dictated by the orbital size, the energy, the variation of angular momentum, and the parity. The E1 transition changes one quantum number of the angular momentum and the parity, while the M1 transition changes one quantum number of the angular momentum but preserves the parity. Other than the E1- and the M1-type of transitions, it is possible to emit multiple photons simultaneously, as the entangled photons. An entangled photon pair describes two photons, the degree of freedom of which is less than the total degree of freedom of two independent photons together. The entangled state is applicable for the quantum communication and the quantum computation. Here, the natural abundance of $^{103}$Rh is 100%. The ground state of $^{103}$Rh is |1/2$^-$> and its Mössbauer state is |7/2$^+$>. The transition between these two states gives energy of 39.8 keV, a half-life of 56.12 min and changes 3 quanta of the angular momentum. If the emission of single photon is free from the any disturbance, the energy resolution is very narrow on the order of $10^{-19}$ eV. However, the neighboring $^{103}$Rh nuclei in crystal are definitely affected by the environment to give interference more significant than the level of $10^{-19}$ eV. The resonant absorption of single photon is therefore impossible. Yao Cheng has observed the low gamma energy from the low-lying excited state of $^{103}$Rh (in form of the poly- and the single-crystal) created by the bremsstrahlung. It indicates the emission of a photon pair[111]. In fact that the natural abundance of $^{103}$Rh is 100%, the neighboring atom must be the same isotope of $^{103}$Rh. The resonant absorption of neighboring nuclei mediated by an entangled photon pair gave the delocalized nuclear excitation, i.e. nuclear exciton. This nuclear exciton contains spin but no charge. Yao Cheng, therefore, call it the nuclear spin-density wave[12].

In case that the change of angular momentum from the transition of the first low-lying excited state is not equal 1, i.e. >2 or =0, there is a possibility to emit multiple photons of entanglement and the resonant absorption by the neighboring nuclei at the ground state. The probability to emit multiple photons is dictated by the type of multipolar transitions, the abundance of identical isotope, the amount of identical isotope, and the environmental temperature. In some case, the cascade emission from a high-level excited state intermediated via the low-lying state will provide a different type of the two-photon energy-time entanglement. However, the entangled multiphoton of interest may provide a wave vector matching the crystal constant, i.e. fulfills the Bragg condition, which creates several phenomena of the superradiance, the strong coupling, and the recoilless emission. The photoelectric effect is suppressed and the nuclear resonance of identical isotope in the crystal is extremely amplified. The size of nuclear exciton is much bigger than the lattice constant that provides an extremely large magneton. The magneton of $^{103}$Rh nuclear exciton is on the order of eV/T, which is about $10^8$ times greater than the conventional nuclear magneton[12]. By applying a magnetic field of the Gauss order, Yao Cheng has observed the reorientation of the nuclear magnetic axis, which is attributed to the enlarged magneton of the delocalized exciton state[13]. The phase transition depends on the excitation density and temperature has also been observed[14,15].

We summarize the magnetoelectric effects available from the topological insulators of the 2D-$Z_2$ and the 3D-$Z_2$ types and the weak $Cr_2O_3$-type materials, which are not the multiferroics.

(1) The amplitude of pseudoscalar field is smaller than 100 [$e^2/h$]. Therefore, a good feature of insulation is required to show the magnetoelectric effects.

(2) Two types of the 3D-$Z_2$ and the 2D-$Z_2$ topological insulators requires low temperature to show magnetoelectric effects, such as 10K.

(3) It is impossible to transform the 3D types to 2D types just by decreasing the thickness of materials, or transform the 2D types to 3D types by increasing the thickness.

(4) It is very difficult to maintain the insulation property of the 3D-$Z_2$ type topological insulator, such as $Bi_2Se_3$, $Bi_2Te_3$, and $Sb_2Te_3$.

Therefore, the known topological insulators have several drawbacks being inconvenient for the applications. The inventor has paid quite a lot of research, design, try and errors to achieve this applicable invention.

SUMMARY OF THE INVENTION

The invention overcomes the drawbacks of the available Magnetoelectric Effect Material to provide an intensive pseudoscalar field such that the magnetoelectric effect becomes practical for the applications.

The invention provides producing methods of Magnetoelectric Effect Material, which enable the practical applications.

The invention provides the selection rules of isotopes and their preparation methods to create nuclear exciton for the strong magnetoelectric effect.

The invention applies following methods to solve the technical problems. The invented Magnetoelectric Effect Material contain selected isotopes to construct their crystal, their alloy crystal or the crystal of their chemical compound. Processes of enrichment or purification of selected isotopes in the crystal, the alloy crystal or the compound crystal are required to achieve the magnetoelectric effects, which are provided by the delocalized nuclear exciton.

The invention also provides another solution to solve the technical problems.

The isotope-enrichment applies the centrifugal method to enrich the selected isotopes in the above-mentioned Magnetoelectric Effect Material.

The purification drives the melting zone to the edge such that the impurities are removed by the floating zone method.

The selection rule of isotopes to generate the delocalized nuclear exciton is the nuclear transition from the first low-lying excited state to the ground state, which changes a quantum number of the angular momentum >2 or =0.

The abundance of above-mentioned isotopes in the crystal of above-mentioned Magnetoelectric Effect Material is 90%-100%. The abundances of each isotope of compound crystal are 90%-100%.

The abundance of above-mentioned isotopes in the crystal of above-mentioned Magnetoelectric Effect Material is 99%-100%. The abundances of each isotope of compound crystal are 99%-100%.

The above-mentioned compound crystal of above-mentioned Magnetoelectric Effect Material is oxides consisting of the oxygen isotope of $^{16}$O, the abundance of which is 99.76%-100%.

The above-mentioned compound crystal of above-mentioned Magnetoelectric Effect Material is carbides consisting of the carbon isotope of $^{12}$C, the abundance of which is 98.89%-100%.

The above-mentioned compound crystal of above-mentioned Magnetoelectric Effect Material is sulfides consisting of the sulfur isotope $^{32}$S, the abundance of which is 95.02%-100%.

The isotopes of above-mentioned Magnetoelectric Effect Material are selected from $^{12}$C, $^{16}$O, $^{19}$F, $^{27}$Al, $^{28}$Si, $^{32}$Si, $^{32}$S, $^{40}$Ca, $^{45}$Ca, $^{45}$Sc, $^{52}$Cr, $^{56}$Fe, $^{59}$Co, $^{89}$Y, $^{93}$Nb, $^{103}$Rh, $^{115}$In, $^{232}$Th and/or $^{238}$U.

The invention applies following methods to its realization. The invented Magnetoelectric Effect Material consisting of selected isotopes to form their crystal, their alloy crystal or the crystal of their chemical compound are prepared to create nuclear exciton insides the crystal.

The invention can also apply following methods to its realization.

The above-mentioned nuclear exciton in the above-mentioned Magnetoelectric Effect Material is generated by the irradiations from radiation sources, the irradiation from the radioactive nuclides or the irradiation from the natural sources.

The above-mentioned radiation sources to prepare the above-mentioned

Magnetoelectric Effect Material are electron, x-rays, neutron, or proton, the energy of which is greater than the energy of the nuclear exciton.

The above-mentioned radioactive nuclides to prepare the above-mentioned Magnetoelectric Effect Material have the multipolar gamma transitions with the long lifetimes.

The radioactive nuclides to prepare the above-mentioned Magnetoelectric Effect Material are $^{178m}$Hf, $^{93m}$Nb or $^{113m}$Cd.

The natural irradiation sources to prepare the above-mentioned Magnetoelectric Effect Material include the vacuum fluctuation or the background radiation.

The enrichment/purification of selected isotopes in the crystal, the alloy crystal, or the compound crystal to prepare the above-mentioned Magnetoelectric Effect Material is required before generating the nuclear exciton.

It may implant or remove impurities of particular isotopes to adjust the decay lifetime of nuclear exciton for the preparing the above-mentioned Magnetoelectric Effect Material.

The abundances of the selected isotopes are 90%-100% in the crystal, the alloy crystal, or the compound crystal to prepare the above-mentioned Magnetoelectric Effect Material.

The abundances of the isotopes are 99%-100% in the crystal, the alloy crystal, or the compound crystal to prepare the above-mentioned Magnetoelectric Effect Material.

The above-mentioned compound crystal to prepare the above-mentioned Magnetoelectric Effect Material is oxides consisting of the oxygen isotope of $^{16}$O, the abundance of which is 99.76%-100%.

The above-mentioned compound crystal to prepare the above-mentioned Magnetoelectric Effect Material is carbides consisting of the carbon isotope of $^{12}$C, the abundance of which is 98.89%-100%.

The above-mentioned compound crystal to prepare the above-mentioned Magnetoelectric Effect Material is sulfides consisting of the sulfur isotope of $^{32}$S, the abundance of which is 95.02%-100%.

The selected isotopes to prepare the above-mentioned Magnetoelectric Effect Material are $^{12}$C, $^{16}$O, $^{19}$F, $^{27}$Al, $^{28}$Si, $^{32}$Si, $^{32}$S, $^{40}$Ca, $^{45}$Ca, $^{45}$Sc, $^{52}$Cr, $^{56}$Fe, $^{59}$Co, $^{89}$Y, $^{93}$Nb, $^{103}$Rh, $^{115}$In, $^{232}$Th and/or $^{238}$U.

The realization of the invention also applies following methods to solve the technical problems. The invented Magnetoelectric Effect Material contain the selected metastable isotopes activated by the pre-irradiation before making the crystal, the alloy crystal or the crystal of their chemical compound, where the irradiation sources are electron, x-rays, neutron, or proton and their energies are higher than the energy of the nuclear exciton.

The invention can also be realized by the following technical procedures.

The isotopes can be mixed into the particular incubating isotopes to form alloy crystal and activated together by irradiation, where the incubating isotopes contain the transition from the first low-lying state to the ground state with a quantum change of angular momentum greater than 2 or equal 0, to prepare the above-mentioned Magnetoelectric Effect Material.

The preparation of Magnetoelectric Effect Material further includes the fabrication methods of the isotope crystals or the isotope alloys. The fabrication into the particular size and the particular dimensions and the particular topological structures of crystal provides a different magnetoelectric effect.

The above-mentioned fabrication includes two-dimensional layer, the thickness of which is of the size of the nuclear exciton and the width and the length of which are much greater than the size of nuclear exciton.

The above-mentioned fabrication includes one-dimensional rod, the diameter of which is of the size of the nuclear exciton and the length of which is much greater than the size of nuclear exciton.

The above-mentioned fabrication includes two-dimensional tube, the thickness of which is of the size of the nuclear exciton and the circumference and the length of which are much greater than the size of nuclear exciton.

The above-mentioned fabrication includes one-dimensional circle, the thickness of which is of the size of the nuclear exciton and the circumference of which is much greater than the size of nuclear exciton.

The above-mentioned fabrication of composite materials with different dimensionalities includes the three dimensional interface of different materials, two dimensional composite layers of different materials, one dimensional junction of different materials, or composite structure of another materials.

Another material in the above-mentioned fabrication method of Magnetoelectric Effect Material includes dielectric, magnetic, magnetoelectric, or multiferroics materials, which provide the required electric/magnetic field for the above-mentioned Magnetoelectric Effect Material.

The above-mentioned fabrication of composite structure of the Magnetoelectric Effect Material provides different magnetoelectric effect at different temperature.

The fabrication method of above-mentioned Magnetoelectric Effect Material includes the interface of different superconducting materials, which contain different flux quantum number to generate a superconductive magnetoelectric material.

The fabrication method of above-mentioned Magnetoelectric Effect Material includes the composition of the photoelectric materials and the above-mentioned Magnetoelectric Effect Material.

The fabrication method of above-mentioned Magnetoelectric Effect Material includes the composition of the piezoelectric materials and the above-mentioned Magnetoelectric Effect Material.

The fabrication method of above-mentioned Magnetoelectric Effect Material includes the composition of the semiconductor materials and the above-mentioned Magnetoelectric Effect Material.

The fabrication method of above-mentioned Magnetoelectric Effect Material includes the composition of the topological insulator or insulator materials and the above-mentioned Magnetoelectric Effect Material.

The fabrication method of above-mentioned Magnetoelectric Effect Material includes the composition of the metallic materials and the above-mentioned Magnetoelectric Effect Material.

Furthermore, the invention can be realized by the following methods, which includes:

(1) The isotopes are selected particularly to generate the nuclear exciton. Except those isotopes of 100% natural abundance, the enrichment of the selected isotopes is required.

(2) The particular combination of isotopes for nuclear exciton can provide to adjust the decay lifetime and the irradiation efficiency.

(3) The particular combination of selected isotopes is applied at certain temperature.

(4) The particular combination of selected isotopes are applied at certain environment, such as radioactive environment.

(5) The magnetoelectric effect of the invention depends on the density of nuclear exciton.

(6) The magnetoelectric effect of the invention depends on the size, the dimensionality, and the topological structure, which have influence on the relation between the exciton density and the magnetoelectric effects.

(7) The magnetoelectric effects of the particular combination of selected isotopes for the invention depend on the size, the dimensionality, and the topological structures.

(8) The magnetoelectric effects of the particular combination of selected isotopes for the invention depend on the combined application with another types of materials.

Furthermore, the purpose of this invention and the know-hows to solve the technical problems are realized by the following concepts.

The invention applies the delocalized nuclear exciton to provide the magnetoelectric effects. The magneton is proportional to its size. The delocalized nuclear exciton have a large magneton because of its enlarged size, otherwise the conventional nuclear magneton is very small. The conventional nuclear excitation is localized at one single nucleus that cannot be spread to the neighboring identical nuclei. The invention applies particular nuclear excitation, which allows the transition via multiple entangled photons such that the nuclear excitation spreads among neighboring identical nuclei, i.e. the delocalized nuclear exciton.

The nuclear exciton inside the crystal enhances the pseudoscalar field required for the magnetoelectric effects.

The applying isotope of this invention can be the unstable isotope, such as $^{113}$Cd. The invention prefers a long lifetime of the unstable isotope, e.g. the half-life of $^{113}$Cd is $7.7\times10^{15}$ years. The ground state of $^{113}$Cd is $|1/2^+\rangle$, while its low-lying excited state is $|11/2^-\rangle$. The transition half-life between these two states is 14.1 years. This transition changes 5 quanta of the angular momentum, which is greater than 2. Therefore, $^{113}$Cd fulfills the required feature to create nuclear exciton.

The applying isotopes of this invention can be the stable isotopes, the natural abundance of which is preferred to be high. For example, $^{52}$Cr is a stable isotope; the natural abundance is 83.8%. The ground state of $^{52}$Cr is $|0^+\rangle$, while its low-lying excited state is $|2^+\rangle$. Although $^{52}$Cr fulfills the conditions to create nuclear exciton, however it requires the enrichment in increase the abundance. The transition half-life of 0.7 ps is too short, which requires then a consisting excitation of the Mössbauer state.

Therefore, the long exciton lifetime of the applied isotopes is preferred.

The natural abundance of 100% is preferred, that allow lowering the manufacturing cost, and otherwise it is necessary to enrich the isotope or applying nuclear reaction to obtain the isotope. Therefore, the stable long-lived Mössbauer isotopes with 100% natural abundance give the advantage, such as $^{45}$Sc, $^{103}$Rh, $^{89}$Y, and $^{93}$Nb.

No matter the high abundance of isotope is achieved by the enrichment or is from the nature, to perform the magnetoelectric effect does not require an insulating feature but requires the feature of a single or a poly crystal. It can be a pure metal, an alloy, a compound material, a semiconductor or an insulator.

The Mössbauer excitation from the ground state can be achieved by the following methods, i.e. the irradiation of electron, photon, neutron, or proton, the energy of which is higher than the energy of the Mössbauer state. For example, the irradiation of bremsstrahlung on Sc, Rh, Y, and Ag can excite the Mössbauer state. The irradiation of the 6-MeV electron on Sc, Rh, Y, and Ag can also excite the Mössbauer state. The irradiation of neutron on Nb can excite the Mössbauer state.

Except the external irradiation sources, the radioactive isotopes, such as $^{178m}$Hf being a state of $|16^+\rangle$ at 2.446 MeV with a half-life of 31 years, can be implanted into crystal to give an internal irradiation source.

The nuclear exciton of this invention depends on the environmental temperature. Therefore, the exciton can be created by the back ground radiation or the vacuum fluctuation at low temperature.

The invention applies the long-lived exciton, such as $^{93}$Nb with a half-life of 16 years. The required crystal or compound can be manufactured after the creation of nuclear excitation.

The invention applies the compound, e.g. oxide, to create the required hardness or the required insulating feature.

Comparing to the available technology, the invention has advantages. From the technical concepts, the purpose of this invention is achieved by the following method.

The invention suggests several kinds of Magnetoelectric Effect Material, the magnetoelectric effect is induced by a pseudoscalar field inside the crystal. The materials are isotopes of the high natural abundance or the highly enriched abundance to form a pure crystal, an alloy crystal or a compound crystal to provide the delocalized exciton and the necessary pseudoscalar field. The unit of pseudoscalar field is $[e^2/h]$, where e is the electric charge and h is the Plank constant. The strength of pseudoscalar field depends on the isotopes themselves, the purification of isotopes, the density of nuclear exciton, the crystal structure, and the operating temperature. The pseudoscalar field inside the crystal is important for the application of quantum computing.

To create the above-mentioned nuclear exciton in an isotope, several conditions are required. The first low-lying Mössbauer state allows the emission of entangled multiple photons. The wave-vector of the entangled state matches the crystal constant to perform a strong coupling such that the nuclear excitation is delocalized to be a nuclear exciton. The condition of Mössbauer state to emit entangled multiple photons is its transition to ground state contain a quantum change of angular momentum to be >2 or =0.

In one example to realize this invention, the method to increase the exciton density can be the irradiated by the external sources, such as electron, X-rays, neutron, proton, and the other kinds of high-energy particles, or implant the radioactive internal sources, which decay via the emission of the entangled multiple photons. No matter the external or the internal sources are applied, the energy of which must be higher than the exciton energy. According to the application requirement, the irradiation to increase exciton can be taken once, multiple times, or continuously.

In one example to realize the invention, the long-lived nuclear excitation can be carried out, such as $^{93m}$Nb before the preparation to achieve the demanded crystal form for the designed magnetoelectric effects.

In one particular example to realize the invention, the creation of nuclear exciton can be created by the background radiation or the vacuum fluctuation without any above-mentioned irradiation below certain temperature, which depends on the exciton type. The following number and material shall not be treated as a restriction to this invention, i.e. the enriched $^{52}$Cr to have magnetoelectric effect from $Cr_2O_3$ below the Neel temperature. This kind of applications is suitable for the environment, such as the space out of earth and at very low temperature.

In one particular example to realize the invention, the exciton density must be increased beyond a threshold value to achieve the strong magnetoelectric effects. The achieved pseudoscalar field is greater than 1 $[e^2/h]$. The higher the density is, the higher the working temperature is. The following numbers are not the restriction of this invention, e.g. the exciton density of a pure $^{93}$Nb crystal has to greater than $10^{12}$ cm$^{-3}$ to have the strong magnetoelectric effects at room temperature.

In one particular example to realize the invention, the natural abundance of the above-mentioned isotope is not 100% and the purity is not 100%, such as $Cr_2O_3$. Increasing the abundance and purity of $^{52}$Cr is preferred for the enhancement of magnetoelectric effects.

In one particular example to realize the invention, the impurity of particular isotope can adjust the decay speed of nuclear exciton. The particular isotope is the isotope able to create nuclear exciton. For example, not a restriction of this invention, the concentration of the impurities of Zr, Y, W in a pure Nb crystal containing the excitation of $^{93m}$Nb have better to be lower than 1 ppm.

In one particular example of this invention, the excitation of selected isotope is mixed into the incubating isotope to form alloy or compound crystal that changes the efficiency of the irradiation. The incubating isotope is capable to create nuclear exciton. When the required amount of nuclear excitation is achieved, the wanted isotope can be purified by the post-process. For example, the following numbers and materials are not the restriction of this invention, take $^{27}$Al to be the incubating isotope, mixed 1% $^{93}$Nb into the crystal of $^{27}$Al crystal. After the irradiation of 5-MeV electron beam create sufficient $^{93m}$Nb, the pure Nb crystal containing $^{93m}$Nb is then obtained by chemical separation.

In one particular example of this invention, it is necessary to control the environment conditions and the crystallization of sample for the nuclear excitation, i.e. high temperature and no crystallization are preferred to increase the amount of nuclear excitation. The temperature is higher than the anneal temperature, even to the melting and evaporating condition without upper but lower limitation of temperature. The isotope is not in form of crystalline, e.g. powder, solution.

In one particular example of this invention, the environmental conditions are applied to control the amount of nuclear exciton. For example, carry out the nuclear excitation first at high temperature and non-crystallization and then cooling down to crystalized. During the cooling process apply magnetic field to maintain the amount of nuclear exciton.

In one particular example of this invention, the fabrication of Magnetoelectric Effect Material into different geometry and dimensionality modifies their features. For example, the two-dimension layer means the thickness is on the order of the size of nuclear exciton. The one dimensionality means the diameter is on the order of the size of nuclear exciton. The magnetoelectric effects and the influence of exciton density are changed by the geometry and dimensionality.

In one particular example to realize this invention, the geometry, the topological structure, or the combination of different materials, such as a three-dimensional interface with different materials, a two-dimensional multilayer with different materials, a one-dimensional junction with different materials provide different magnetoelectric effects, where the assisting materials can be dielectric, magnetic, magnetoelectric, or multiferroics to provide the necessary electric field, magnetic field, or to modify the electric or magnetic features.

In one particular example to realize this invention, the geometry, the topological structure, or the combination of different materials, such as a three-dimensional interface with different materials, a two-dimensional multilayer with different materials, a one-dimensional junction with different materials provide different magnetoelectric effects, where the assisting materials can be superconductor, where the magnetoelectric superconductors have different flux quanta.

In one particular example to realize this invention, the geometry, the topological structure, or the combination of different materials, such as a three-dimensional interface with different materials, a two-dimensional multilayer with different materials, a one-dimensional junction with different materials provide different magnetoelectric effects, where the assisting materials can be the above-mentioned Magnetoelectric Effect Material, the interface of which adjust the decay speed of nuclear exciton or adjust the strength of magnetoelectric effects by using a single kind of the magnetoelectric material.

In one particular example to realize this invention, the geometry, the topological structure, or the combination of different materials, such as a three-dimensional interface with different materials, a two-dimensional multilayer with different materials, a one-dimensional junction with different materials provide different magnetoelectric effects, where the assisting materials can be photoelectric materials, the interface of which changes the luminosity, polarization, or the efficiency of photoelectric effects.

In one particular example to realize this invention, the geometry, the topological structure, or the combination of different materials, such as a three-dimensional interface with different materials, a two-dimensional multilayer with different materials, a one-dimensional junction with different materials, the interface of insulator and the Magnetoelectric Effect Material is to modify the thermal conduction.

In one particular example to realize this invention, the geometry, the topological structure, or the combination of different materials, such as a three-dimensional interface with different materials, a two-dimensional multilayer with different materials, a one-dimensional junction with different materials, the interface of sound-generating or sound-damping materials with the Magnetoelectric Effect Material changes the strength, the polarization, and the phase of sound wave, or the efficiency to generate the sound wave.

In the present invention, the pseudoscalar field is able to provide the magnetoelectric effect of invented materials. The pseudoscalar field equals the topological invariance inside the topological insulator, where the electron motion is protected by the topological invariance at the edge state. The photon at the edge state is abnormal, e.g. the speed of light is not dictated by the permeability and permittivity. When the material containing pseudoscalar field enters the superconductive state, such as Rh and Nb, there are Majorana states available for the topological quantum computation, and there can be applied on the quantum computer.

In this invention, the materials to provide magnetoelectric effect contain nuclear exciton, which is sensitive to the external field and suitable to make a detector to detect the particular external field characterized with the spin-0 pseudoscalar field, the spin-1 electromagnetic field, or the spin-2 gravitational waves.

The magnetoelectric material of this invention may provide an unconventional thermal conductivity. When the density of nuclear exciton exceeds a certain threshold, the nuclear exciton condenses. The following numbers is not to restrict the invention, e.g. the threshold density of nuclear exciton is $10^{12}$ cm$^{-3}$ in the pure $^{103}$Rh or the pure $^{93}$Nb crystals at room temperature.

Accordingly, the invention provides the nuclear exciton to enhance the magnetoelectric effects and the manufacturing method for various materials. They are the selection rules of isotope, the manufacturing of materials, and the method of applications. The technical knowledge belongs to area of the material science and the nuclear science. The invention applies the isotopes performing the transition of entangled multiple photons to create the nuclear exciton. The concentration of isotope can be increased by the enrichment or the purification processes. The density of nuclear exciton is increased by the irradiation that leads to increase the magnetoelectric effects of the isotope crystal, alloy crystal or the compound crystal. The implanted impurity of other isotopes, which is able to create nuclear exciton too, may adjust the decay speed of nuclear exciton and the excitation efficiency of the nuclear exciton by the irradiation.

Accordingly, the invention has the following advantages, the numbers in which are not the restriction of this invention.

(1) The magnetoelectric effect included in this invention has a very large pseudoscalar field, e.g. on the 1000 [e2/h] order under earth field. The need of insulating feature of material is therefore decreased. It provides sufficient effect and functionality from the edge state even with a metallic sample.

(2) The invention can operate at the temperature much higher than 10 K.

(3) The invention can be formed into a one-dimensional, a two-dimensional, and a three-dimensional topological structures, and their geometry of various size features.

(4) The invention is able to be controlled by the applying magnetic field.

(5) The material of the present invention has high hardness and stability.

Accordingly, the invention has many advantages, which is suitable for the applications and not known from the available production. This invention is new and provides significant advances in character and functionality that leads to practical applications.

The technical concepts of this invention have been briefly introduced in the description above. The following instruction gives an example to carry out the invention detailed by figures.

FIGURES DESCRIPTION

FIG. 1 is an example of this invention. The photon spectrum emitted from the Mössbauer state of Nb, which is carried out by the neutron irradiation in a reactor, where the abscissa axis is the x-ray energy of detected photon and the ordinate axis is the count number.

Figure 2:
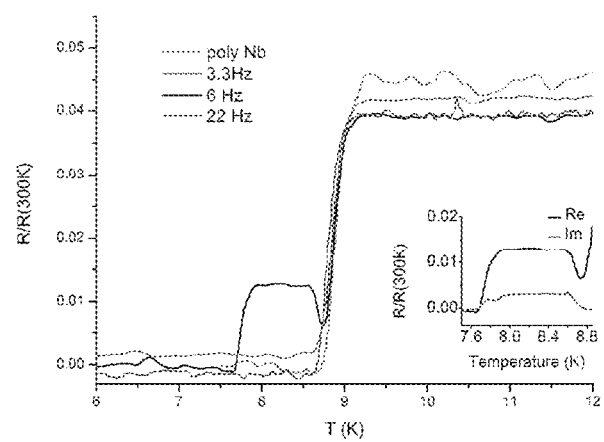

FIG. 2 is the electric resistant measured by the four point method. The normal critical temperature of the Nb superconductivity appears at 9.3 K. The abnormal superconducting state appears only with 6-Hz drive.

Figure 3:
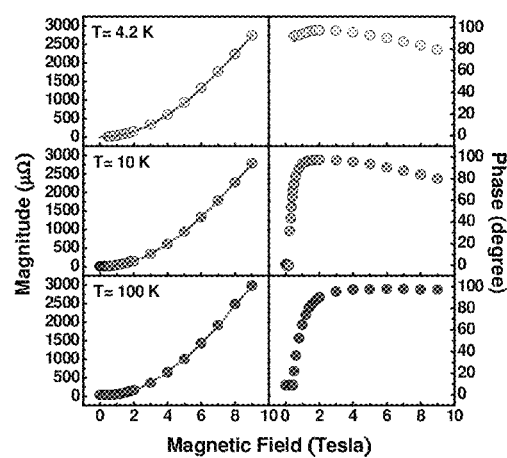

FIG. 3 shows the impedance depending on the temperature and the applied magnetic field measured by the four-point method.

DETAIL DESCRIPTION OF THE INVENTION

An example of the invention carried out by the excitation of niobium.

The following is the detailed description of one example, which is not the restriction of this invention.

The inventor carried out the nuclear excitation of two niobium samples in form of single crystal and poly-crystal in the Hsinchu reactor by the neutron beam. When the density of nuclear excitation exceeds $10^{12}$ cm$^{-3}$, the nuclear exciton enters a different state. The isotope of $^{93}$Nb, documented with the ground state of |9/2$^+$>, the Mössbauer state of |1/2$^-$>, a transition energy of 30.8 keV carrying 4 quanta of angular momentum, and a half-life of 16.13 years, has the natural abundance of 100%.

As described above, the energy distribution of single photon is too sharp to be absorbed by the other neighboring $^{93}$Nb nuclei at ground state. However, the evidence of entangled multiphoton shows up in the x-ray spectrum in FIG. 1, where the four peaks between 7 and 12 keV are the L-line x-rays from W, two peaks at 15.7 keV and 17.7 keV are the K-line x-rays from Zr, two peaks at 16.6 keV and 18.6 keV are the K-line x-rays from Nb, which are the internal conversion from the Mössbauer transition from $^{93m}$Nb. The low-lying state of the stable isotopes $^{182}$W, $^{90}$Zr, $^{91}$Zr, $^{92}$Zr, $^{94}$Zr, $^{96}$Zr can decay via entangled multiple photons to support the nuclear exciton.

The inventors wish to modify the description of FIG. 1, which was not clearly documented. The L-lines of $^{182}$W were mainly contributed by the β decay from $^{182}$Ta, which was generated by the impurity of $^{181}$Ta in Nb crystal to absorb one neutron during the neutron irradiation in the Hinchu reactor. The K-lines of Zr were mainly contributed by the $^{92}$Zr emitted from the electron capture of $^{92m}$Nb, which was generated by the process of $^{93}$Nb absorbing one neutron but emitting two neutrons. The anomalous decay time of these x-rays, which led to the conclusion that the partial x-rays are generated by the nuclear exciton, are not clearly documented. Now, after three-year monitoring, we have now another important evidence of abnormal lifetimes from $^{93m}$Nb, which is more obvious than the abnormal lifetime of $^{182}$Ta and $^{92m}$Nb, while the argument of abnormal decay time to prove the nuclear exciton is still reserved.

The lattice of the single-crystal sample of Nb was destroyed by the neutron bombardment such that no superconductivity could be achieved. After the anneal process, the superconductivity was recovered, as shown in FIG. 2. It shows an abnormal step of resistance around 8 K, which is driven by the ac current of 6-Hz and 50 mA. The method of four-point measurement is detailed in the reference [15]. There should be no dissipation of drive current when the sample was cooled below the superconducting temperature without any applied magnetic field except the earth field of 0.4 Gauss. The resistance in FIG. 2 reveals several facts. It is impossible to have the response from the nuclear magnetic resonance by the drive current from the four-point measuring method without an alternative driving field. Unless the drive voltage between two leads of measurement can create the magnetic field by the magnetoelectric effect, the dissipative nuclear magnetic resonance of exciton can be achieved.

The assumed magnetoelectric became pronounced, when the strong magnetic field was applied. FIG. 3 shows the field- and temperature-dependent impedance from a measurement done by the four-point method with the ac drive current of 4 Hz and 130 mA. The phase between the read voltage and the drive current shows that the impedance moves from resistive to inductive by increasing the field. Increasing the drive frequency, the induction increases, that proves the energy stored in a magnetic field. The induction is proportional to the square of the applied field, where the strong storing magnetic field comes from the magnetoelectric effect. The estimation show the magnetoelectric effect is proportional to the square of applied field and reached a value around $10^8$ [$e^2$/h] at 9 T.

The magnetoelectric effect is not attributed to the spin-orbit interaction and is not induced by the multiferroics, instead, it is induced by the nuclear exciton, the pseudoscalar filed of which is very large.

According to the feature of magnetoelectric effect, the applications of this invention include:

(1) The advanced thermal conductivity of the edge state can be applied to enhance the thermal conduction, such as heat pipe.

(2) The invention can be applied to the write head of the hard disk to replace the coil for generating the magnetic field that can reduce the production cost.

(3) The Majorana state of this invention can be applied to the quantum computer.

(4) The invention can be applied to the photoelectric conversion.

(5) The invention can be applied to detect the electromagnetic field, such as the earth field.

(6) The invention can be applied to detect the gravitational waves.

(7) The invention can be applied to detect the dark matter.

The above descriptions are some good example, which cannot be treated as the restriction of this invention. The experts, who are familiar with the technology about this invention, can carry out the example by certain modification on the procedure. Accordingly, the minor modification of the procedure is treated to be the same reported invention.

REFERENCES

1. F. W. Hehl, Y. N. Obukhov, J.-P. Rivera, and H. Schmidt, Phys. Rev. A 77, 022106 (2008);
2. F. W. Hehl, Y. N. Obukhov, J.-P. Rivera, and H. Schmidt, Eur. Phys. J. B. 71, 321 (2009);
3. F. W. Hehl, Y. N. Obukhov, J.-P. Rivera, and H. Schmidt, arXiv:0707.4407;
4. M. Fiebig, J. Phys. D 38, R123 (2005);
5. M. Z. Hasan, C. L. Kane, Rev. Mod. Phys. 82, 3045 (2010);
6. X.-L. Qi and S. C. Zhang, arxiv:1008.2026 (2010);
7. A. M. Essin, J. E. Moore, and D. Vanderbilt, Phys. Rev. Lett. 102, 146805 (2009);
8. R. Ramesh, N. A. Spaldin, Nat. Mater. 6, 21 (2007);
9. J. P. Hannon and G. T. Trammell, Hyperfine Interactions, 123/4, 127 (1999);
10. F. Wilczek, Phys. Rev. Lett. 58, 1799 (1987);
11. Y. Cheng and B. Xia, arXiv:0908.0628;
12. Y. Cheng, arXiv:0907.1446;
13. Y. Cheng, arXiv:0906.5417, ICAME, 19-24 Jul. 2009, Vienna, Austria;
14. Y. Cheng, B. Xia, Q.-X. Jin and C. P. Chen, arXiv: 0807.1231, ICAME, 19-24 Jul. 2009, Vienna, Austria;
15. Y. Cheng, B. Xia and C. P. Chen, arXiv:0812.2166, Physica Scripta, 79, 055703, 2009;
16. Yao Cheng and Chi-Hao Lee, arXiv:1102.1766V2.

The invention claimed is:

1. A magnetoelectric material, wherein the said material is made by isotope crystals, isotope alloy crystals or the compound crystals of particular isotope, which is enriched and/or purified to increase the purity of the said isotope, such that the crystal of the isotope, of the alloy isotopes, or of the chemical compound of isotopes to achieve the delocalized nuclear exciton for the magnetoelectric effects.

2. The magnetoelectric material of claim 1, wherein the enrichment of isotope in the magnetoelectric material applies the centrifugal process.

3. The magnetoelectric material of claim 1, wherein the purification of isotope in the magnetoelectric material applies the floating zone method to drive the impurities from inside to the edge of a sample by moving the local melting zone.

4. The magnetoelectric material of claim 1, wherein the isotope to generate the delocalized nuclear exciton in the magnetoelectric material has the transition from the first low-lying excited state to the ground state containing the quantum number change of angular momentum unequal to 1, i.e. greater than 2 or equal to 0.

5. The magnetoelectric material of claim 1, wherein the abundance of each isotope in the isotope crystal or the isotope-compound crystal of the magnetoelectric material is 90%-100%.

6. The magnetoelectric material of claim 5, wherein the abundance of each isotope in the isotope crystal or the isotope-compound crystal of the magnetoelectric material is 99%-100%.

7. The magnetoelectric material of claim 1, wherein the oxygen isotope in the oxide compound crystal of the magnetoelectric material is $^{16}$O, the abundance of which is 99.76%-100%.

8. The magnetoelectric material of claim 1, wherein the carbon isotope in the carbide compound crystal of the magnetoelectric material is $^{12}$C, the abundance of which is 98.89%-100%.

9. The magnetoelectric material of claim 1, wherein the sulfur isotope in the sulfide compound crystal of the magnetoelectric material is $^{32}$S, the abundance of which is 95.02%-100%.

10. The magnetoelectric material of claim 1, wherein the isotopes in the crystal of the magnetoelectric material are selected from $^{12}$C, $^{16}$O, $^{19}$F, $^{27}$Al, $^{28}$Si, $^{32}$S, $^{40}$Ca, $^{45}$Sc, $^{52}$Cr, $^{56}$Fe, $^{59}$Co, $^{89}$Y, $^{93}$Nb, $^{103}$Rh, $^{115}$In, $^{232}$Th and $^{238}$U.

11. A manufacturing process of the magnetoelectric material, comprising the step to generate the nuclear exciton in the magnetoelectric material consisting of a single isotope, multiple isotopes or an isotope compound.

12. The manufacturing process of claim 11, wherein the manufacturing means to generate the nuclear exciton in the magnetoelectric material include irradiation by the radiation sources, radioactive nuclides, and natural sources.

13. The manufacturing process of claim 12, wherein the radiation sources in the manufacturing processes include the electron beam, x-rays, neutron, or proton, the radiation energy of which is greater than the energy of nuclear exciton.

14. The manufacturing process of claim 12, wherein the internal irradiation by the radioactive nuclides in the manufacturing processes implants the particular radioactive nuclides into the crystal consisting of a single isotope, multiple isotopes, or the isotope compound; the long-lived radioactive isotope contain the multipolar gamma transition via entangled multiple photons.

15. The manufacturing process of claim 14, wherein the radioactive nuclides are selected from $^{178m}$Hf, $^{93m}$Nb, or $^{113m}$Cd.

16. The manufacturing process of claim 12, wherein the natural methods are the excitation by the vacuum fluctuation or background radiation.

17. The manufacturing process of claim 11, further comprising the step of the enrichment or/and the purification of isotope for the crystal of one isotope, multiple isotopes or isotope compound before the creation of nuclear exciton.

18. The manufacturing process of claim 14, wherein the insert or removal or certain isotope impurities can adjust the decay lifetime of nuclear exciton.

19. The manufacturing process of claim 11, wherein the abundance of isotope in the isotope crystal or compound crystal is 90%-100%.

20. The manufacturing process of claim 19, wherein the abundance of isotope in the isotope crystal or in each element of compound crystal is 99%-100%.

21. The manufacturing process of claim 11, wherein the isotope compound is oxide, the oxygen isotope of which is $^{16}$O with abundance of 99.76%-100%.

22. The manufacturing process of claim 11, wherein the isotope compound is carbide, the carbon isotope of which is $^{12}$C with abundance of 98.89%-100%.

23. The manufacturing process of claim 11, wherein the isotope compound is sulfide, the sulfur isotope of which is $^{32}$S with abundance of 95.02%-100%.

24. The manufacturing process of claim 11, wherein the isotopes are selected from $^{12}$C, $^{16}$O, $^{19}$F, $^{27}$Al, $^{28}$Si, $^{32}$S, $^{40}$Ca, $^{45}$Sc, $^{52}$Cr, $^{56}$Fe, $^{59}$Co, $^{89}$Y, $^{93}$Nb, $^{103}$Rh, $^{115}$In, $^{232}$Th and $^{238}$U.

25. A method to manufacture the Magnetoelectric Effect Material, comprising:
    irradiation by the radiation sources to generate the metastable nuclear excitation;
    manufacturing the irradiated isotopes to be the crystal of single isotope or multiple isotopes or the isotope compound;
        wherein the radiation sources are electron, x-rays, neutron, or proton, the energy of which is higher than the energy of nuclear exciton.

26. The method of claim 25, further comprising mixing the excitation of metastable state into the incubating materials before the irradiation to form alloy or compound crystals; the said incubating materials are those isotopes have the quantum change of angular momentum for the transition from the first low-lying state to the ground state not equal to 1, i.e. >2 or =0.

27. The method of claim 25, further comprising the step of the crystal of a single isotope, multiple isotopes, or the isotope compound being fabricated into crystal of particular size, of different dimensionality, of different topological structure to achieve different magnetoelectric effect.

28. The method of claim 27, wherein the particular size of the crystal means two dimensional layer with a thickness about the size of nuclear exciton, and with the length and the width to be much greater than the size of nuclear exciton.

29. The method of claim 27, wherein the said particular size of the crystal means one dimensional line with a diameter about the size of nuclear exciton, and with the length to be much greater than the size of nuclear exciton.

30. The method of claim 27, wherein the said particular size of the crystal means two dimensional tube with a thickness about the size of nuclear exciton, and with the length and diameter to be much greater than the size of nuclear exciton.

31. The method of claim 27, wherein the said particular size of the crystal means one dimensional circle with a diameter about the size of nuclear exciton, and with the circumference to be much greater than the size of nuclear exciton.

32. The method of claim 27, wherein the said composition of different dimensionality and topological structures means the interface between different three-dimensional materials, multilayer of different materials, and the junction between different materials of one-dimensional rods.

33. The method of claim 32, wherein the said composite structure of different materials include dielectric, magnetic, magnetoelectric, multiferroics to provide the required electric field and/or magnetic field.

34. The method of claim 32, wherein the said composite structure of different materials has different magnetoelectric effects at different temperature.

35. The method of claim 32, wherein the composite structure of different materials includes two superconductors, which have different magnetic flux quanta.

36. The method of claim 32, wherein the composite structure of different materials includes the photoelectric material and the magnetoelectric material.

37. The method of claim 32, wherein the composite structure of different materials includes the piezoelectric material and the magnetoelectric material.

38. The method of claim 32, wherein the composite structure of different materials includes the semiconductor material and the magnetoelectric material.

39. The method of claim 32, wherein the composite structure of different materials includes the material of the topological insulator and the magnetoelectric material.

40. The method of claim 32, wherein the composite structure of different materials includes the metallic material and the magnetoelectric material.

* * * * *